United States Patent [19]

Carlsson

[11] 4,048,579
[45] Sept. 13, 1977

[54] FEED-FORWARD AMPLIFIER

[75] Inventor: Rolf Christer Carlsson, Hagersten, Sweden

[73] Assignee: Telefonaktiebolaget L M Ericsson, Stockholm, Sweden

[21] Appl. No.: 708,845

[22] Filed: July 26, 1976

[30] Foreign Application Priority Data

Aug. 28, 1975 Sweden .............................. 7509550

[51] Int. Cl.² ............................................ H03F 1/00
[52] U.S. Cl. ...................................... 330/151; 330/53; 330/149
[58] Field of Search .......................... 330/53, 149, 151; 333/10

[56] References Cited

U.S. PATENT DOCUMENTS

| | | | |
|---|---|---|---|
| 3,541,467 | 11/1970 | Seidel | 330/151 X |
| 3,624,532 | 11/1971 | Seidel | 330/9 |
| 3,815,040 | 6/1974 | Seidel | 330/151 X |

Primary Examiner—Rudolph V. Rolinec
Assistant Examiner—Lawrence J. Dahl
Attorney, Agent, or Firm—Hane, Sullivan & Spiecens

[57] ABSTRACT

A feed-forward amplifier with an input arranged to receive wide-band signals and an output to supply a linearly amplified version of these has two parallel signal paths arranged between such input and output, one of the signal paths includes a cascade connection of a signal amplifier and a delay network and the second signal path includes an error amplifier, an error extraction circuit having a directional coupler in which an input side has a first pair of conjugate first and second ports and is connected partly to the input of the feed-forward amplifier and partly to an output of the signal amplifier and an output side has a second pair of conjugate third and fourth ports, the fourth port being connected to an input of the error amplifier, and an error injection circuit which has a first and a second input connected to an output of the delay network and to an output of the error amplifier, respectively and an output connected to the output of the feed-forward amplifier, the error extraction circuit having the third port of the directional coupler connected to an input of the signal amplifier and a summation circuit having a first and second input connected to the input of the feed-forward amplifier and to the output of the signal amplifier, respectively, and an output connected to the second port of the directional coupler.

8 Claims, 1 Drawing Figure

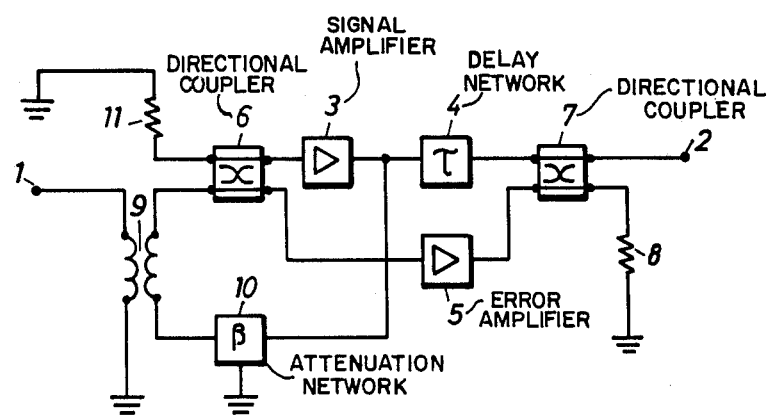

FEED-FORWARD AMPLIFIER

This invention relates to a feed-forward amplifier with an input to receive wide-band signals and an output to supply a linearly amplified version of these having two parallel signal paths arranged between the input and the output of the feed-forward amplifier, one of the signal paths being a cascade connection of a signal amplifier and a delay network and the second signal path being an error amplifier, an error extraction circuit which includes a directional coupler in which an input side has a first pair of conjugate first and second ports and is connected partly to the input of the feed-forward amplifier and partly to an output of the signal amplifier and an output side has a second pair of conjugate third and fourth ports, the fourth port being connected to an input of the error amplifier, and an error injection circuit which has a first and a second input connected to an output of the delay network and to an output of the error amplifier, respectively, and an output connected to the output of the feed-forward amplifier.

A known feed-forward amplifier of the above defined type that is described in the Swedish patent No. 7102055-6 requires besides said delay network a further delay network which is cascade connected to the error amplifier. The delay networks become expensive and bulky when they must delay wide-band signals. In addition, their phase shift should be adjustable. A description of the technical problems involved is given in greater detail in the Bell System Technical Journal, Vol. 47, pp 651-722, May-June 1968 and Vol. 50, pp 2879-2916, November 1971.

An object of the present invention is to provide a feed-forward amplifier which like the known feed-forward amplifier attains a linear gain of wide-band signals, but is different in that it achieves this result utilizing only one delay network.

The invention, the characteristics of which appear from the appended claim, will now be described more in detail with reference to the accompanying drawing which shows a feed-forward amplifier in a preferred embodiment of the invention.

The drawing shows a feed-forward amplifier which has an input 1 and an output 2 arranged to receive wide-band signals and to supply a linearly amplified version of these, respectively. Two parallel signal paths are arranged between the input 1 and the output 2. One of the signal paths has a cascade connection of a signal amplifier 3 and a delay network 4 and the second signal path comprising an error amplifier there 5. In the feed-forward amplifier is included an error extraction circuit which comprises a directional coupler 6 in which an input side has a first pair of conjugate first and second ports and is connected partly to the input 1 of the feed-forward amplifier and partly to the output of the signal amplifier 3 and an output side has a second pair of conjugate third and fourth ports, the fourth port being connected to an input of the error amplifier 5, and an error injection circuit which according to the embodiment is constituted by a directional coupler 7 which has a first and a second port in a first pair of conjugated ports connected to the output of the delay network 4 and to the output of the error amplifier 5, respectively, and a third and a fourth port in a second pair of conjugate ports connected to the output 2 of the feed-forward amplifier and resistively connected to ground via a resistor 8, respectively.

The error extraction circuit is according to the invention characterized in that it has the third port of the directional coupler 6 connected to an input of the signal amplifier 3 and comprises a summation circuit in the form of transformer 9 which has a first and a second input connected to the input 1 of the feed-forward amplifier and to the output of the signal amplifier 3, respectively, and an output connected to the second port of the directional coupler 6 and arranged to supply a difference signal to the coupler. Any error component generated by the signal amplifier 3 and supplied on is output and added to a linarly amplified signal component will on the third and fourth port of the directional coupler 6 appear substracted from the signal component. This fact permits a cancellation of the error component to take place in the directional coupler 7 after a suitable amplification in the error amplifier 5 and delay in the delay network 4. The two directional couplers 6 and 7 effectively isolate the two signal paths from each other at the inputs of the amplifiers 3 and 5 and at the outputs of the delay network 4 and the amplifier 5, respectively. As a consequence of the fact that the feed-forward amplifier is arranged to amplify wide-band signals, the isolation that the directional coupler 6 provides between the two signal paths is essential in order to prevent reflection phenomena from spoiling the cancellation of the error. component.

The cancellation of the error component is dependent on the fact that the error amplifier 5 introduces only a negligible distortion. In this respect the error amplifier 5 is more critial than the signal amplifier 3. Consequently it is advantageous if the transmission coefficient $S_{24}$ between the second and fourth port in the directional coupler 6 is chosen near the value one although the coupling coefficient $S_{23}$ between the second and third port in the same directional coupler 6 than becomes small according to the relation $|S_{23}|^2 + |S_{24}|^2 = 1$ with the consequence that an increased signal gain is required in the signal amplifier 3.

The above mentioned summation circuit is not particularly critical regarding the isolation between its inputs and it is in the preferred embodiment of the invention constituted by a transformer 9 which has a primary side connected to the input 1 of the feed-forward amplifier and a secondary side a first end of which is connected to the second port of the directional coupler 6 and an attenuation network 10 via which a second end of the secondary side of the transformer 9 is connected to the output of the signal amplifier 3. The first port of the directional coupler 6 is in this embodiment resistively connected to earth via a resistor 11. The attenuation network 10 may include reactive elements to give the feed-forward amplifier a desired frequency response, the error amplifier 5 in a suitable manner being given a corresponding frequency response to ensure the cancellation of any error component generated by the signal amplifier 3.

In the feed-forward amplifier according to the invention the delay network 4 is for delaying the transfer of an error component to the first port of the directional coupler 7, the error component being generated by the signal amplifier 3 and appearing on its output added to a linearly amplified signal component. The delayed error component shall coincide in time with the same error component subtracted from the signal component and transferred to the second port of the directional coupler 7 via the attenuation network 10, the transformer 9, the directional coupler 6 and the error amplifier 5. To achieve an accurate coincidence the delay network 4 is suitably provided with an adjustable phase shifter.

The directional coupler 7 adds on its third port the signal components from the two signal paths in order to cancel any error component generated by the signal amplifier 3. The signal power is partly transferred via the fourth port of the directional coupler 7 to the resistor 8 where it is dissipated in the form of heat. It is therefore suitable that the coupling coefficient $S_{14}$ between the first and the fourth port in the directional coupler 7 be small. Then also the coupling coefficient $S_{23}$ becomes small with the consequence that an increased gain is required in the error amplifier 5 which implies a greater cost for this amplifier. The directional coupler 7 may of course be replaced by a summation circuit in the form of a transformer of the same type as the transformer 9 in order to achieve a low power dissipation which advantage then is obtained at the price of a reduced isolation between the outputs from the delay network 4 and the error amplifier 5. A discussion of these problems is given in greater detail in for example the English patent specification No. 1,302,605.

I claim:

1. A feed-forward amplifier for receiving an input signal and emitting an output signal comprising: a main signal amplifier having an input port and an output port; first signal processing means for forming a difference signal between the received input signal and the signal at the output port of said main signal amplifier; dividing means for dividing the difference signal into first and second difference signal components and having first and second output ports for emitting the first and second difference signal components respectively; first connecting means for connecting the first output port of said dividing means to the input port of said main signal amplifier whereby the first difference signal component is fed to said main signal amplifier; and second signal processing means having first and second input ports and an output port for arithmetically combining the signals received at its input ports and emitting the result signal at its output port; second connecting means for connecting the output of said main signal amplifier to the first input port of said second signal processing means; and third connecting means for connecting the second output port of said dividing means to the second input port of said second signal processing means.

2. The feed-forward amplifier of claim 1 wherein said first signal processing means is a transformer.

3. The feed-forward amplifier of claim 1 wherein said second signal processing means is a directional coupler.

4. The feed-forward amplifier of claim 1 wherein said dividing means is a directional coupler.

5. The feed-forward amplifier of claim 2 wherein said third connecting means is an error signal amplifier.

6. The feed-forward amplifier of claim 1 wherein said second connecting means is a signal delaying means.

7. The feed-forward amplifier of claim 6 wherein said first signal processing means is a transformer and said dividing means is a directional coupler.

8. The feed-forward amplifier of claim 7 wherein said second signal processing means is another directional coupler.

* * * * *